(12) United States Patent
Suzuki et al.

(10) Patent No.: US 10,800,261 B2
(45) Date of Patent: Oct. 13, 2020

(54) BATTERY STATE ESTIMATION APPARATUS, ASSEMBLED BATTERY, ENERGY STORAGE SYSTEM, AND METHODS OF USING THE SAME

(71) Applicant: GS Yuasa International Ltd., Kyoto (JP)

(72) Inventors: Hikaru Suzuki, Kyoto (JP); Takeyuki Shiraishi, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 380 days.

(21) Appl. No.: 15/896,763

(22) Filed: Feb. 14, 2018

(65) Prior Publication Data

US 2018/0236891 A1   Aug. 23, 2018

(30) Foreign Application Priority Data

Feb. 20, 2017   (JP) ................................ 2017-028747

(51) Int. Cl.
*H01M 10/44* (2006.01)
*H01M 10/46* (2006.01)
(Continued)

(52) U.S. Cl.
CPC .......... *B60L 3/0046* (2013.01); *B60L 11/1862* (2013.01); *B60L 58/12* (2019.02); *G01R 31/382* (2019.01); *G01R 31/392* (2019.01); *G01R 31/396* (2019.01); *H01M 10/0525* (2013.01); *H01M 10/425* (2013.01);
(Continued)

(58) Field of Classification Search
CPC ...... H02J 7/0026; H02J 7/0021; H02J 7/0047; H02J 7/04; G01R 31/396; G01R 31/382; G01R 31/392; B60L 58/12

USPC ......... 320/104, 132, 149, DIG. 21; 324/427, 324/433; 702/63, 64

See application file for complete search history.

(56) References Cited

U.S. PATENT DOCUMENTS

| 10,209,320 B2 * | 2/2019 | Cha ........................ G01R 31/36 |
| 2012/0065824 A1 | 3/2012 | Takahashi et al. |

(Continued)

FOREIGN PATENT DOCUMENTS

| DE | 102011112533 A1 | 3/2013 |
| EP | 2259376 A1 | 12/2010 |

(Continued)

OTHER PUBLICATIONS

European Patent Office, Extended European Search Report for Application No. 18156232.3, dated Jul. 13, 2018, 13 pages, Germany.

*Primary Examiner* — Edward Tso
(74) *Attorney, Agent, or Firm* — Alston & Bird LLP

(57) ABSTRACT

A state estimation apparatus configured to estimate a state of an assembled battery including a plurality of energy storage devices. The energy storage devices each have a small-variation region where an open circuit voltage (OCV) variation amount relative to a residual capacity is smaller, and a variation region where the OCV variation amount relative to the residual capacity is greater than the OCV variation amount relative to the residual capacity in the small-variation region. The state of the assembled battery is estimated based on a varying position of the variation region relative to an actual capacity of the plurality of energy storage devices.

21 Claims, 15 Drawing Sheets

(51) Int. Cl.
  *B60L 3/00* (2019.01)
  *G01R 31/396* (2019.01)
  *B60L 58/12* (2019.01)
  *G01R 31/392* (2019.01)
  *G01R 31/382* (2019.01)
  *B60L 11/18* (2006.01)
  *H01M 10/0525* (2010.01)
  *H01M 10/42* (2006.01)
  *H01M 10/48* (2006.01)

(52) U.S. Cl.
  CPC ....... *H01M 10/48* (2013.01); *B60L 2240/547* (2013.01); *B60L 2240/549* (2013.01); *H01M 2010/4271* (2013.01); *Y02T 10/7005* (2013.01); *Y02T 10/705* (2013.01); *Y02T 10/7044* (2013.01)

(56) References Cited

U.S. PATENT DOCUMENTS

| | | |
|---|---|---|
| 2014/0019001 A1 | 1/2014 | Nishizawa |
| 2016/0329738 A1 | 11/2016 | Shiraishi et al. |
| 2016/0370431 A1* | 12/2016 | Sejima ............... G01R 31/3648 |

FOREIGN PATENT DOCUMENTS

| | | |
|---|---|---|
| EP | 2559095 A1 | 2/2013 |
| EP | 3106892 A1 | 12/2016 |
| JP | 2010-266221 A | 11/2010 |
| JP | 2010-283922 A | 12/2010 |
| JP | 2011-075314 A | 4/2011 |
| JP | 2013-088183 A | 5/2013 |
| JP | 2014-147222 A | 8/2014 |
| JP | 2014-225942 A | 12/2014 |
| JP | 2016-126887 A | 7/2016 |
| JP | 2016-145795 A | 8/2016 |
| JP | 2016-220504 A | 12/2016 |
| WO | WO 2016/166713 A2 | 10/2016 |
| WO | WO 2017/006319 A1 | 1/2017 |

* cited by examiner

FIG. 6

| REGION | RANGE OF SOC |
|---|---|
| VARIATION REGION I | LESS THAN 30% |
| SMALL-VARIATION REGION II | 30% TO LESS THAN 66% |
| VARIATION REGION III | 66% TO LESS THAN 68% |
| SMALL-VARIATION REGION IV | 68% TO LESS THAN 95% |
| VARIATION REGION V | 95% OR HIGHER |

BATTERY STATE ESTIMATION APPARATUS, ASSEMBLED BATTERY, ENERGY STORAGE SYSTEM, AND METHODS OF USING THE SAME

CROSS REFERENCE TO RELATED APPLICATIONS

The present application claims priority to and the benefit of Japanese Patent Application No. 2017-028747, filed on Feb. 20, 2017, the contents of which as are hereby incorporated by reference in their entirety.

BACKGROUND

Related Field

The technique disclosed in the present specification relates to a state estimation apparatus.

Description of Related Art

JP 2014-225942 A is known as an energy storage system for starting the engine of a vehicle. The energy storage system of this kind employs, in place of a lead-acid battery, a secondary battery such as a lithium ion battery, which can be reduced in size or weight as compared to the lead-acid battery.

A lithium ion battery including an energy storage device whose positive electrode is made of lithium iron phosphate and whose negative electrode is made of graphite resembles a lead-acid battery in operational voltage range, and is more compatible with a lead-acid battery than a secondary battery made of other materials. However, the correlation between a state of charge (SOC) and an open circuit voltage (OCV) of an energy storage device whose positive electrode is made of lithium iron phosphate and whose negative electrode is made of graphite has a small-variation region where variations in OCV is small over a wide range of about from 30 to 95[%] of the SOC. This makes it difficult to estimate, based on the OCV, any abnormal state of the energy storage device such as deterioration or abnormality of the energy storage device. It is particularly difficult to detect a minute internal short-circuit (soft short-circuit) in the small-variation region.

BRIEF SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present specification will disclose a technique for estimating whether or not an energy storage device is in an abnormal state.

A state estimation apparatus according to an aspect of the present invention is configured to estimate a state of an assembled battery including a plurality of energy storage devices. The energy storage devices each have a small-variation region where an open circuit voltage (OCV) variation amount relative to a residual capacity (remaining charge) is smaller, and a variation region where the OCV variation amount relative to the residual capacity is greater than that in the small-variation region. The state of the assembled battery is estimated based on a varying position of the variation region relative to an actual capacity of the plurality of energy storage devices.

BRIEF DESCRIPTION OF THE FIGURES

The foregoing and other features of the present invention will become apparent from the following description and drawings of an illustrative embodiment of the invention in which:

FIG. 6 is a table showing SOC ranges in respective regions of the SOC-OCV correlation of the energy storage device.

DETAILED DESCRIPTION OF VARIOUS EMBODIMENTS

Overview of Present Embodiment

Figure 1:
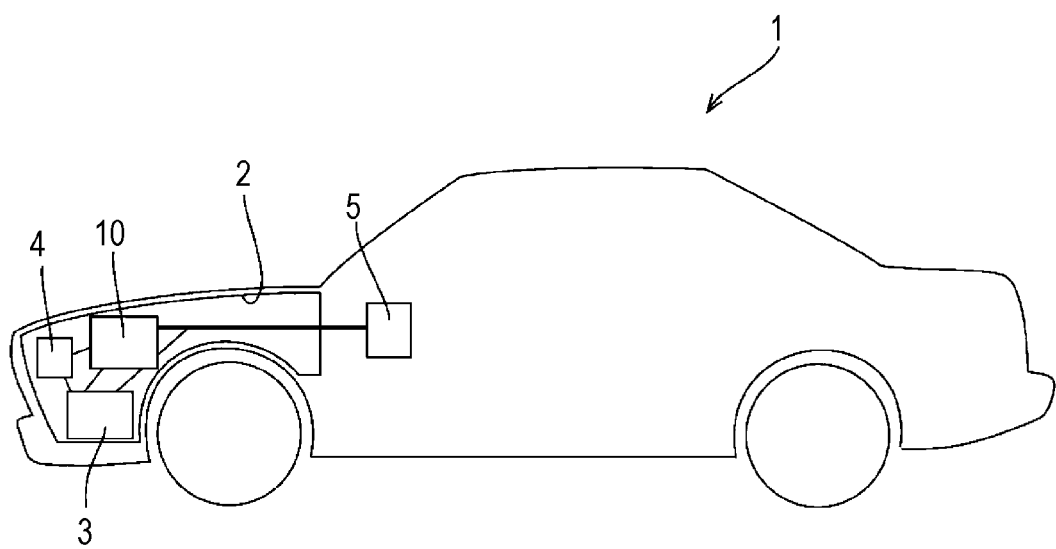
FIG. 1 illustrates a vehicle according to a first embodiment.

Firstly, a description will be given of the overview of a state estimation apparatus disclosed in the present embodiment.

A state estimation apparatus according to an aspect of the present invention is configured to estimate a state of an assembled battery including a plurality of energy storage devices. The energy storage devices each have a small-variation region where an open circuit voltage (OCV) variation amount relative to a residual capacity is smaller, and a variation region where the OCV variation amount relative to the residual capacity is greater than that in the small-variation region. The state of the assembled battery is estimated based on a varying position of the variation region relative to an actual capacity of the plurality of energy storage devices.

The technique disclosed in the present specification can estimate any deterioration or abnormality in the energy storage devices and assembled battery, based on the varying position of the variation region. When the position of the variation region in any of the energy storage devices largely varies, such as (1) when the ordinal levels of the variation region of the energy storage devices change places, or (2) when the position of the variation region in the energy storage devices deviates from the allowable range, the state estimation apparatus can estimate that deterioration or abnormality in the energy storage devices and assembled battery has occurred.

An unused energy storage device whose positive electrode is made of an iron-based material and whose negative electrode is made of a graphite-based material is generally known that, in the SOC-OCV correlation, the range where the SOC is about from 30 to 95[%] is a small-variation region where variations in OCV is flat (smaller), and the range where the SOC is equal to or smaller than 30[%] or equal to or greater than 95[%] is a variation region where variations in OCV is greater than that in the small-variation region.

As a result of study on deterioration of energy storage devices, the present inventors have learned that, with an energy storage device whose positive electrode is made of an iron-based material and whose negative electrode is made of a graphite-based material, when the energy storage device deteriorates, in the relationship between the deterioration of the energy storage device and the SOC-OCV correlation, the small-variation region where the SOC is from 30[%] to 95[%] shortens.

The present inventors have focused on the fact that, in accordance with the shortening of the small-variation region associated with the deterioration of the energy storage device, the position of the variation region in the energy storage device varies.

The "SOC" refers to the state of charge of an energy storage device 21 where the SOC of 100[%] indicates the full-charge state, and to a percentage of the residual capacity of the energy storage device at each time point relative to the capacity of the energy storage device in the full-charge state (a battery capacity). The present inventors have arrived at the idea of estimating the state of the assembled battery based on the varying position of the variation region using the correlation between the residual capacity and the OCV by comparing the varying position of the variation region of the energy storage devices in the correlation between the residual capacity and the OCV.

With such a configuration, in the case where the position of the variation region of any of the energy storage devices largely changes, such as when the ordinal levels of the variation region of the energy storage devices change places, or the position of the variation region of any of the energy storage devices deviates from the allowable range, it can be estimated that any deterioration or abnormality is occurring with the energy storage device, and consequently with the assembled battery. It is also possible to estimate an occurrence of a minute internal short-circuit in the small-variation region.

The energy storage devices may each have an intermediate region being the variation region between the small-variation regions being two in number, and the state estimation apparatus may estimate the state of the assembled battery based on a varying position of the intermediate region relative to the actual capacity of the plurality of energy storage devices.

The present inventors have found that, in the range of about from 30 to 95[%] of the residual capacity, while little variations associated with deterioration of the energy storage device is shown in the small-variation region at a position where the residual capacity is smaller than the intermediate region (the variation region) with a slight potential difference between two small-variation regions (around the point where the residual capacity is about 65[%]), the small-variation region at a position where the residual capacity is greater shortens in accordance with the deterioration of the energy storage device. Further, the present inventors have focused on the fact that the energy storage device of this kind is used in the range where the residual capacity is about from 30 to 95[%] in order to secure the performance of the high input performance and the high output performance.

The present inventors have found that, by estimating the state of the energy storage devices or the assembled battery based on the varying position of the intermediate region, estimation can be performed more frequently than the case where the estimation is performed with the other variation regions (the variation regions at a position where the residual capacity is smaller, or with the variation region where the residual capacity is greater).

That is, by more frequently estimating the state of the energy storage devices or the assembled battery based on the varying position of the intermediate region, the estimation precision improves as compared to, for example, the case where the estimation is performed with the variation region at a position where the residual capacity is smaller, or with the variation region where the residual capacity is greater.

The state estimation apparatus may estimate the state of the assembled battery based on a comparison as to the varying position of the intermediate region in each of the energy storage devices.

With such a configuration, by conducting a relative comparison as to the intermediate region of each of the energy storage devices, for example, in relation to the ordinal levels of the varying position of the intermediate region of the energy storage devices changing places, it can be estimated that any deterioration or abnormality is occurring with the energy storage devices, and consequently with the assembled battery without any complicated process or the like.

The state estimation apparatus may estimate the state of the assembled battery by calculating a variation amount of the actual capacity in each of the energy storage devices based on a first position being a position of the intermediate region of the plurality of energy storage devices at an unused time point or before last use and a second position being a position of the intermediate region of the plurality of energy storage devices after use.

With such a configuration, the state of the energy storage devices, such as deterioration or abnormality of the energy storage devices, can be estimated from the variation amount of the actual capacity of the energy storage devices based on the first position of the energy storage devices at an unused time point or before last use and the second position after use.

The state estimation apparatus may estimate an occurrence of abnormality with the assembled battery, when the variation amount of the actual capacity in each of the energy storage devices becomes outside an allowable range within a predetermined time.

With such a configuration, also in the case where abnormality occurs with every energy storage device within a predetermined time such as within a month, abnormality of the energy storage devices can be estimated.

The technique disclosed in the present specification is applicable to a state estimation method and a state estimation program for estimating the state of an assembled battery.

First Embodiment

With reference to FIGS. 1 to 12, a description will be given of embodiments disclosed in the present specification.

As shown in FIG. 1, the present embodiment is an energy storage apparatus 10 installed in an engine room 2 of a vehicle 1. In the engine room 2, the energy storage apparatus 10 is connected to a vehicle load 3 such as a starting motor for starting the engine or an electronic component, and a vehicle power generator 4 such as an alternator.

Figure 2:
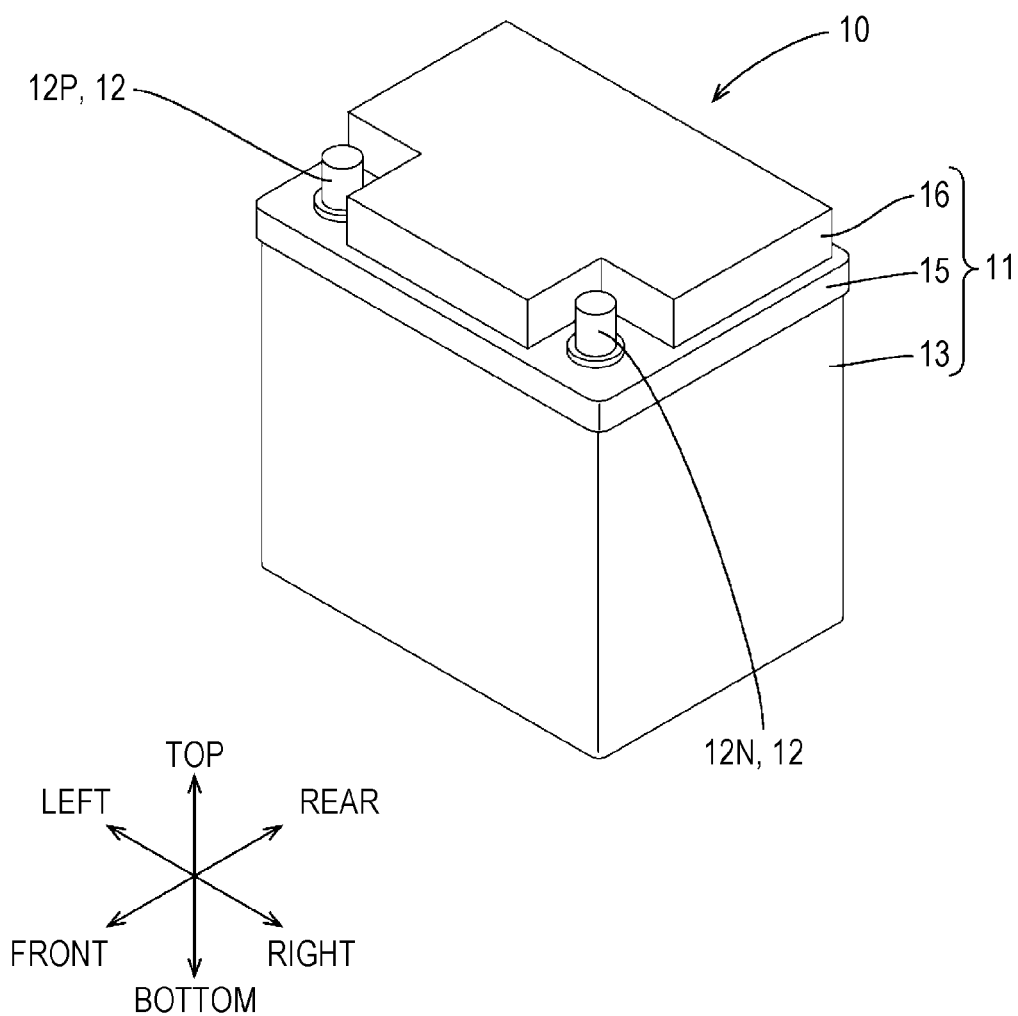
FIG. 2 is a perspective view of an energy storage apparatus.
Figure 3:
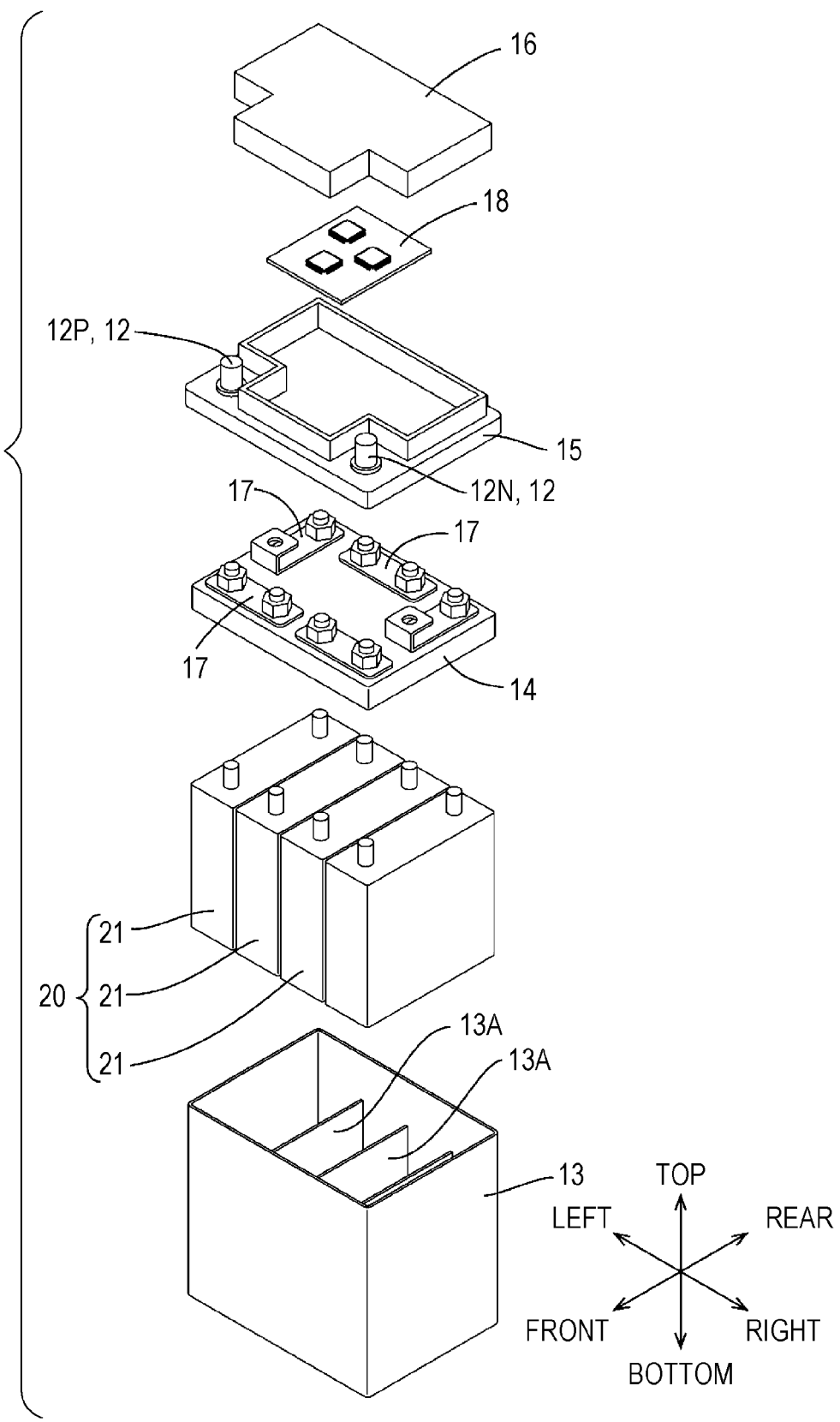
FIG. 3 is an exploded perspective view of the energy storage apparatus.

As shown in FIG. 2, the energy storage apparatus 10 includes a battery case 11 having a block shape. As shown in FIG. 3, the battery case 11 houses an assembled battery 20 made up of a plurality of (four in the present embodiment) energy storage devices 21 connected in series, a control board 18, and the like.

In the following description, the top-bottom direction shown in FIGS. 2 and 3 indicates the top-bottom direction of the battery case 11 when the battery case 11 is horizontally placed on the installation surface with no inclination. The front-rear direction shown in FIGS. 2 and 3 indicates the direction along the short-side portion (the depth direction) of the battery case 11, in which the front left side in the drawings indicates the front side of the battery case 11. The right-left direction shown in FIGS. 2 and 3 indicates the direction along the long-side portion of the battery case 11, in which the front right side in the drawings indicates the right side of the battery case 11.

The battery case 11 is made of synthetic resin. As shown in FIG. 3, the battery case 11 includes a case body 13 having a box-shape and opening upward, a positioning member 14 positioning a plurality of energy storage devices 21, a middle lid 15 mounted on an upper part of the case body 13, and a top lid 16 mounted on an upper part of the middle lid 15.

As shown in FIG. 3, in the case body 13, a plurality of cell chambers 13A respectively housing the plurality of energy storage devices 21 are juxtaposed to each other in the right-left direction.

Figure 5:
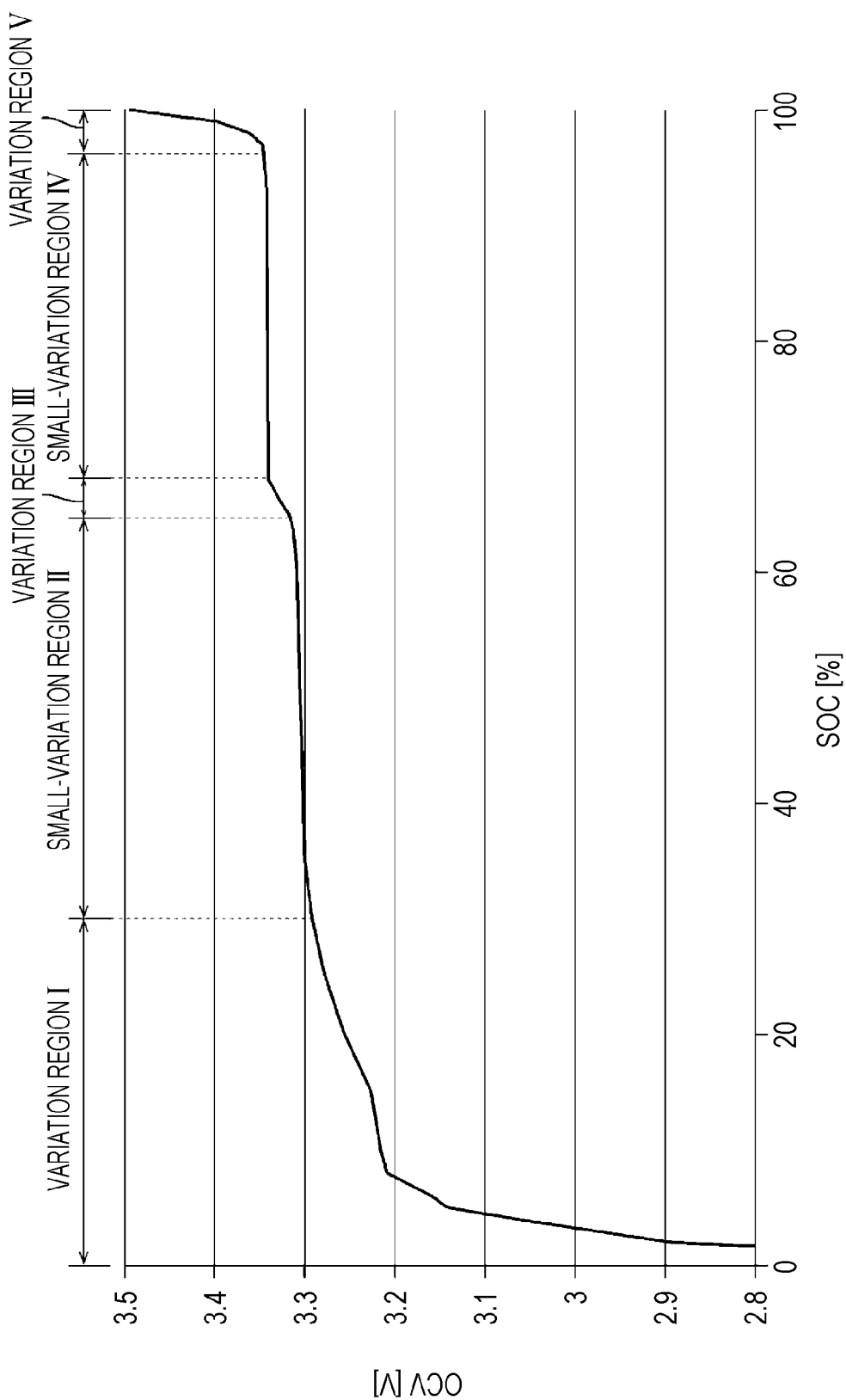
FIG. 5 is a graph showing a SOC-OCV correlation of an energy storage device.

The energy storage devices 21 each may be, for example, a lithium ion battery using a negative active material of a graphite-based material such as graphite, easily graphitizable carbon, less graphitizable carbon, or the like, and a positive active material of iron phosphate such as lithium iron phosphate. Such an energy storage device 21 shows, for example, correlation between an open circuit voltage (OCV) and a state of charge (SOC) shown in FIG. 5 (hereinafter, referred to as a "SOC-OCV correlation"). As shown in FIGS. 5 and 6, with the SOC-OCV correlation, the state of charge of the energy storage device 21 can be divided into the following five regions.

In regions II and IV of the five regions, the variations in OCV of an energy storage device 21 have a slope of less than a predetermined value relative to the SOC. That is, the variations in OCV are extremely small relative to the variations in SOC (hereinafter, these regions are referred to as "the small-variation regions" II, IV). Specifically, a small-variation region is, for example, a region where the variations in OCV are from 2 to less than 6 [mV] relative to a variation of 1[%] in SOC.

On the other hand, in the remaining three regions I, III, V (the regions other than the small-variation regions II, IV), the variations in OCV of the energy storage device 21 have a positive slope of at least a predetermined value relative to the SOC. That is, as compared to the small-variation regions, variations in OCV relative to the SOC are relatively great (hereinafter, these regions are referred to as "the variation regions" I, III, V). Specifically, in the variation regions, for example, variations in OCV is from 2 to 6 [mV] or greater relative to a variation of 1[%] in SOC. The variation region III in which the SOC is around 67[%] corresponds to the intermediate region between the two small-variation regions II and IV.

As shown in FIG. 3, a plurality of bus bars 17 are disposed on the upper surface of the positioning member 14. By the positioning member 14 being disposed at the upper part of the plurality of energy storage devices 21 disposed in the case body 13, the plurality of energy storage devices 21 are positioned. The plurality of energy storage devices 21 are connected in series by the plurality of bus bars 17, to structure the assembled battery 20.

The middle lid 15 is substantially quadrangular as seen in a plan view. As shown in FIGS. 2 and 3, at the opposite ends in the right-left direction of the middle lid 15, a pair of external terminal portions 12 to which not-shown battery terminals of the vehicle 1 are connected is provided as being embedded in the middle lid 15. The pair of external terminal portions 12 is made of, for example, metal such as lead alloy. Of the pair of external terminal portions 12, one is a positive electrode terminal portion 12P and the other one is a negative electrode terminal portion 12N.

As shown in FIG. 3, the middle lid 15 houses the control board 18. By the middle lid 15 being mounted on the case body 13, the assembled battery 20 and the control board 18 are connected to each other.

A description will be given of the electric configuration of the energy storage apparatus 10.

Figure 4:
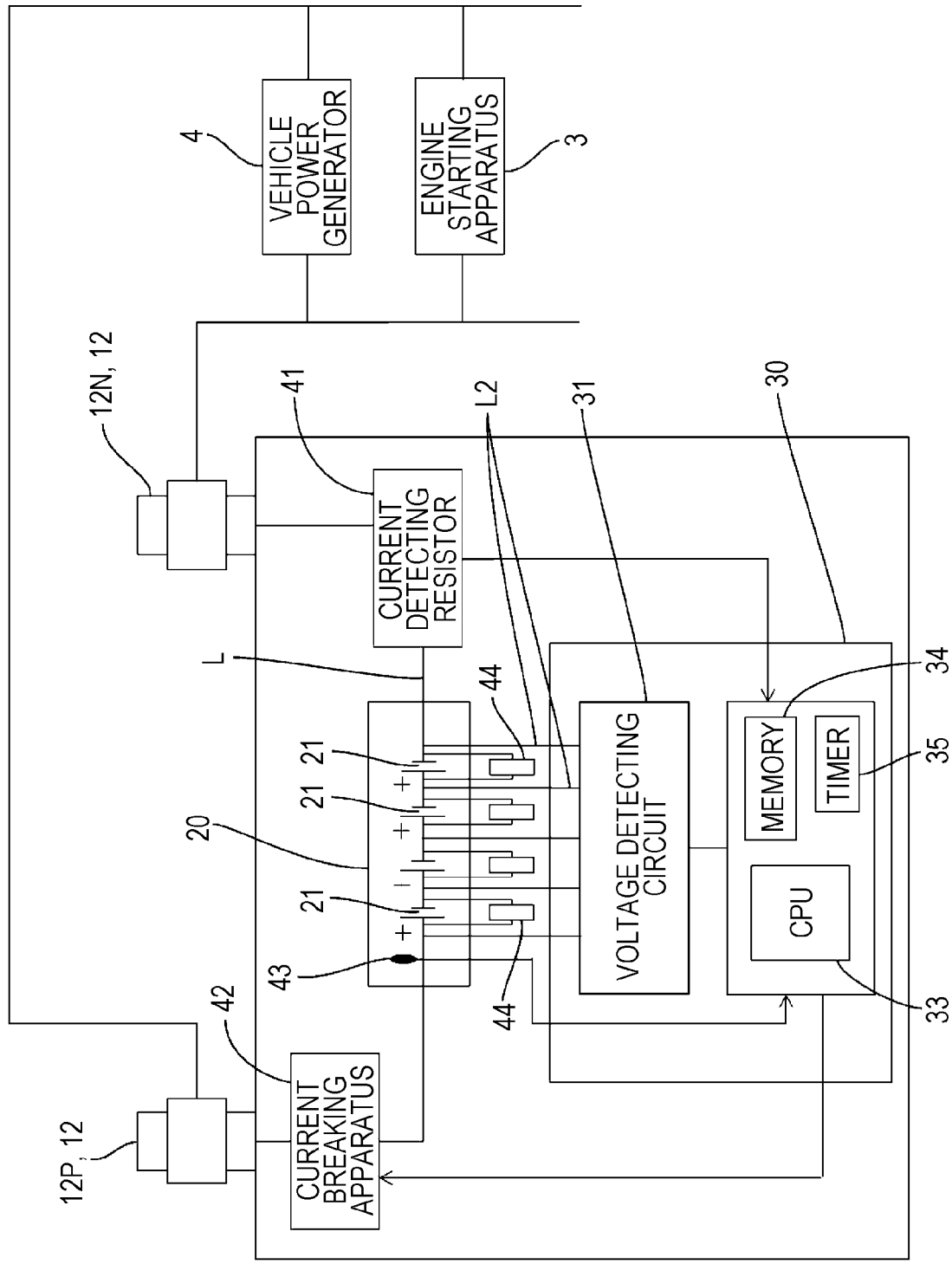
FIG. 4 is a block diagram showing an electric configuration of the energy storage apparatus.

As shown in FIG. 4, the energy storage apparatus 10 includes the assembled battery 20, a battery management unit (hereinafter referred to as the "BMU", an example of "state estimation apparatus") 30, a current detecting resistor 41, a current breaking apparatus 42, a temperature sensor 43, and discharge circuits 44.

The assembled battery 20, the current detecting resistor 41, and the current breaking apparatus 42 are connected in series via an energizing line L. The positive electrode of the assembled battery 20 is connected to the positive electrode terminal portion 12P via the current breaking apparatus 42, and the negative electrode is connected to the negative electrode terminal portion 12N via the current detecting resistor 41.

The current detecting resistor 41 is a resistor that detects current of the assembled battery 20. By the voltage across the opposite ends of the current detecting resistor 41 being read by the BMU 30, the current of the assembled battery 20 is detected.

The current breaking apparatus 42 is, for example, a semiconductor switch such as an FET or a relay. In response to an instruction (a control signal) from the BMU 30, the current breaking apparatus 42 breaks the current between the assembled battery 20 and the positive electrode terminal portion 12P.

The temperature sensor 43 is of the contact type or the contactless type, and measures the temperature of the assembled battery 20.

As shown in FIG. 4, the discharge circuits 44 are respectively provided at the energy storage devices 21 in parallel connection to the energy storage devices 21. The discharge circuits 44 are each a circuit in which a not-shown discharge resistor and a not-shown discharge switch are connected in series. In response to an instruction from the BMU 30, the discharge circuits 44 close their respective discharge switches, thereby individually discharging the energy storage devices 21.

The BMU 30 includes a voltage detecting circuit 31, a CPU 33 being the central processing unit, a memory 34, and a timer 35, which are mounted on the control board 18.

Further, the BMU 30 is supplied with power from the assembled battery 20 by being connected to the energizing line L.

The voltage detecting circuit 31 is connected to the opposite ends of the energy storage devices 21 via voltage detecting lines L2. In response to an instruction from the CPU 33, the voltage detecting circuit 31 detects the cell voltage of each energy storage device 21 and the battery voltage of the assembled battery 20 (the total voltage of the plurality of energy storage devices 21).

The memory 34 is, for example, a nonvolatile memory such as a flash memory or an EEPROM. The memory 34 stores various programs such as a program for managing the energy storage devices 21 or the assembled battery 20, a state estimation program for estimating deterioration or any abnormal state of the energy storage devices 21 and the assembled battery 20, and data required in executing the programs (the actual capacity of the energy storage devices 21, the allowable deterioration value, and the like).

The actual capacity of each energy storage device 21 is explained as follows. For example, each manufactured energy storage device 21 is subjected to constant current constant voltage charge to attain the full-charge state (e.g., 3.5 [V], 6 [A] or lower). Subsequently, the energy storage device 21 is discharged to reach the end-of-discharge voltage (e.g., 2.0 [V] (1 C)). The current amount discharged from the full-charge state to the end-of-discharge voltage by the rated current is the actual capacity (the capacity that can be extracted from the fully charged energy storage device 21).

The timer 35 measures time. For example, the timer 35 measures the time of the voltage detecting circuit 31 measuring the voltage of the energy storage devices 21 and the time difference between voltage measurements, and outputs them to the CPU 33.

The CPU 33 is the central processing unit, and monitors the current, voltage, and the like of the energy storage devices 21 based on the output of the current detecting resistor 41, the voltage detecting circuit 31, and the like. Upon detecting any abnormality, the CPU 33 activates the current breaking apparatus 42, thereby preventing the assembled battery 20 from malfunctioning.

The assembled battery 20 is installed having the plurality of energy storage devices 21 connected in series and arranged in close proximity to each other in the case body 13. Accordingly, when the energy storage apparatus 10 is used, the energy storage devices 21 disposed centrally attain higher temperatures than the energy storage devices 21 disposed on the outer side. Then, when the energy storage apparatus 10 is used for a predetermined period, deterioration of the energy storage devices 21 disposed centrally further deteriorates in addition to normal deterioration, and the actual capacity thereof reduces.

Though the energy storage devices 21 of the assembled battery 20 are manufactured through the identical process, they vary from each other in actual capacity. Specifically, in the case where the actual capacity of four energy storage devices 21 being unused since manufacture is measured by the above-described method, the energy storage devices 21 vary from each other in actual capacity, for example as follows: the first energy storage device showing 20.0 [Ah], the second energy storage device showing 20.4 [Ah], the third energy storage device showing 19.8 [Ah], and the fourth energy storage device showing 20.2 [Ah].

Further, the present inventors have learned that, with the energy storage device 21 whose positive electrode is made of an iron-based material and whose negative electrode is made of a graphite material, there exists the characteristic, in the relationship between the deterioration of the energy storage device 21 and the SOC-OCV correlation, that the small-variation region IV (the small-variation region where the SOC is in the range of from 68[%] to 95[%]) shortens when the energy storage device 21 has deteriorated.

The present inventors have focused on the fact that, when the position of the full-charge state is fixed in the SOC-OCV correlation of the energy storage device 21, the position of the variation region III varies in accordance with the shortening of the small-variation region IV. The present inventors have found that an occurrence of any deterioration or abnormality of the energy storage devices 21 and consequently of the assembled battery 20 can be estimated by conducting a state estimation process based on the varying position of the variation region III at periodical or arbitrary timing at a predetermined time interval (e.g., one month).

A description will be given of the relationship between the deterioration of the energy storage device 21 and the SOC-OCV correlation. Subsequently, with reference to FIG. 7, a description will be given of the state estimation process.

The "SOC" refers to the state of charge of the energy storage device 21. The SOC attains 100[%] in the full-charge state and attains 0% when the end-of-discharge voltage is reached.

In relation to the deterioration of the energy storage device 21, when the unused energy storage device 21 and the deteriorated energy storage device 21 are compared against each other based on the SOC-OCV correlation in which the X-axis indicates a SOC [%], SOC 0[%] and SOC 100[%] become the same in position in the SOC-OCV correlation.

That is, the proportion of the variations in OCV extends longer in the X-axis direction (the direction in which the SOC varies) in the SOC-OCV correlation of the deteriorated energy storage device 21 than the SOC-OCV correlation of the unused energy storage device 21. In view of the foregoing, in order to clarify the relationship between the residual capacity and the OCV of the energy storage device, the graphs of FIGS. 8 to 12 show the correlation between the residual capacity and the OCV (hereinafter referred to as the "residual capacity-OCV correlation") in which the X-axis indicates a residual capacity [Ah] of the energy storage devices 21 and the Y-axis indicates an OCV [V]. In the graphs of FIGS. 8 to 12, an unused energy storage device □ is represented by the solid line, and the deteriorated energy storage device □ is represented by the dashed-dotted line, both of which of the energy storage devices 21 being aligned to each other at the position of the full-charge state.

Figure 8:
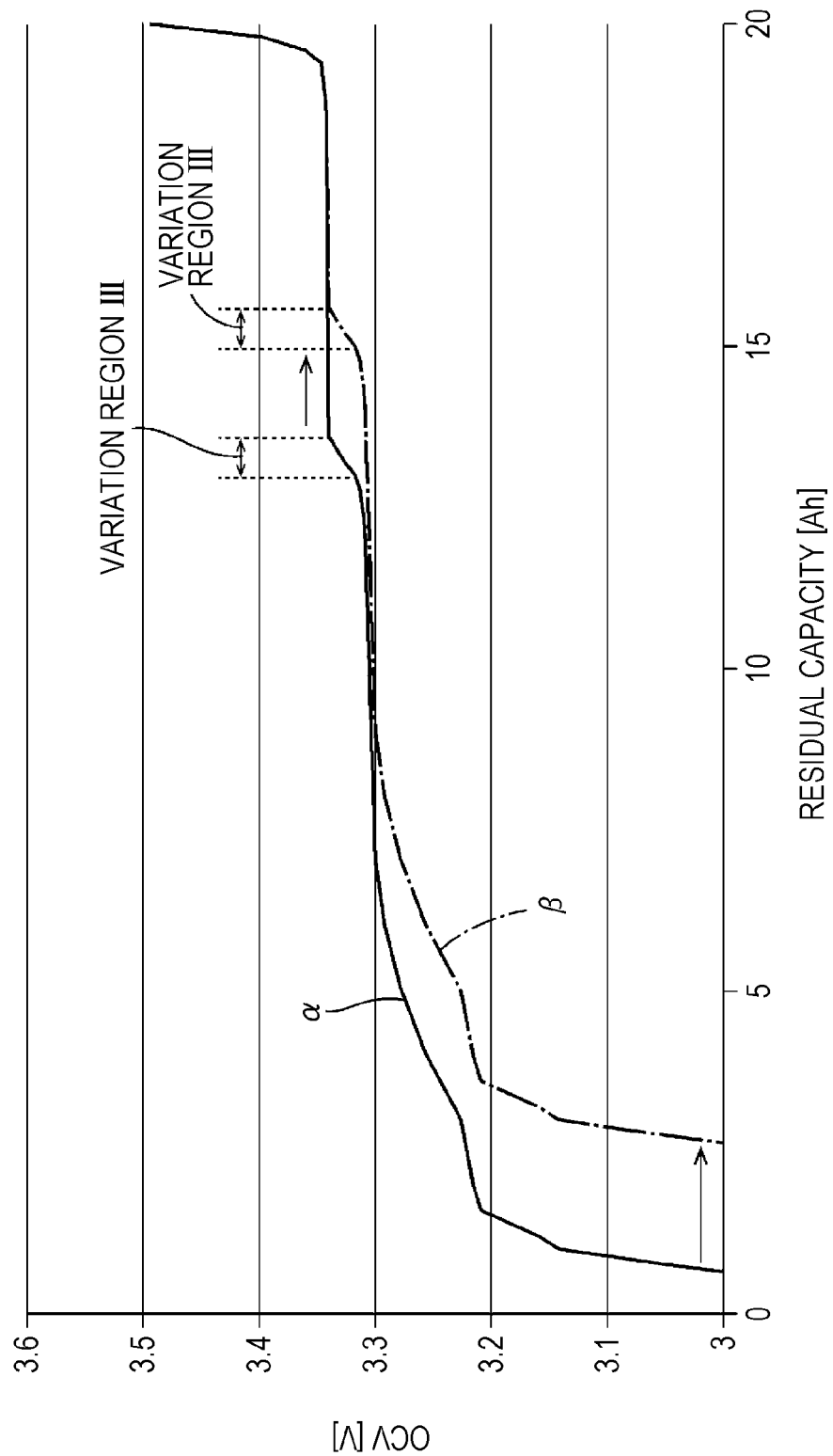
FIG. 8 is a graph showing the relationship between deterioration of the energy storage device and the SOC-OCV correlation.

In the graph of FIG. 8, comparing the unused energy storage device □ and the deteriorated energy storage device □ against each other, the variation region I and the small-variation region II in which the residual capacity is smaller than that in the variation region III show little variations in capacity in accordance with deterioration of the energy storage device 21.

However, the small-variation region IV of the deteriorated energy storage device □ is shortened as compared to the small-variation region IV of the unused energy storage device □, from which a reduction in actual capacity of the energy storage device 21 can be seen.

That is, aligning the unused energy storage device 21 and the deteriorated energy storage device 21 at the position of the full-charge state, as shown in FIG. 8, it can be seen that the position of the variation region III shifts toward the higher residual capacity when the energy storage device 21 has deteriorated.

In the state estimation process, a CPU 33 calculates the deterioration amount of the energy storage devices 21 based on the capacity difference between the actual capacity of the energy storage devices 21 at an unused time point or before last use and the actual capacity of the used energy storage devices 21, and estimates whether or not any deterioration or abnormality is occurring with the assembled battery 20.

Figure 7:
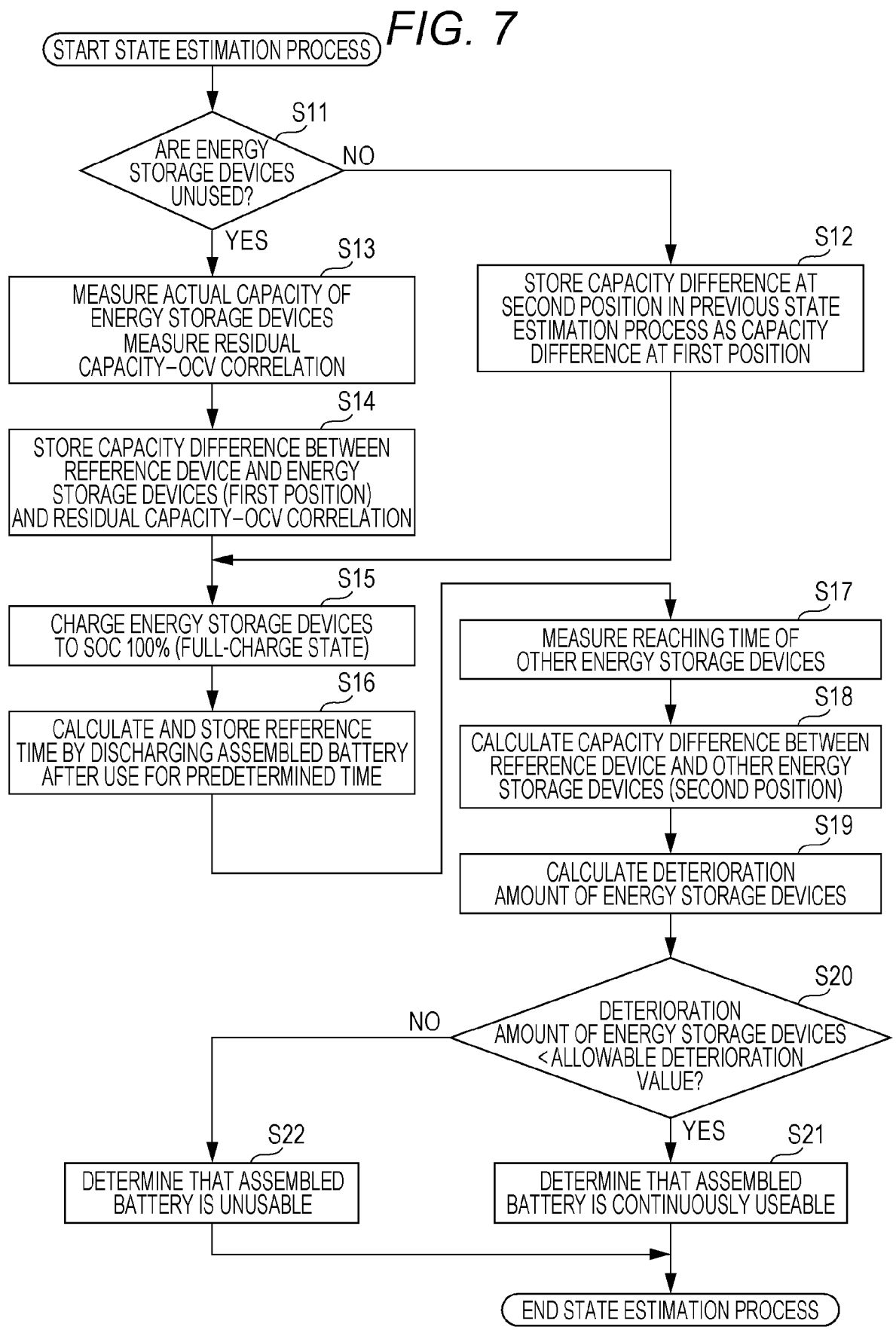
FIG. 7 is a flowchart showing a state estimation process.

As shown in FIG. 7, the CPU 33 determines whether or not the energy storage devices 21 are unused (S11). When the energy storage devices 21 are unused since manufacture (S11: YES), the CPU 33 measures the actual capacity of the energy storage devices 21 at an unused time point and the residual capacity-OCV correlation at this time point (S13), and calculates the capacity difference (the capacity variations) between the reference device which is the energy storage device 21 whose actual capacity is the smallest and each of the other energy storage devices 21 as the capacity difference at the first position (see FIG. 11).

Then, the CPU 33 stores, in the memory 34 of the BMU 30, the relationship between the variation region III in the residual capacity-OCV correlation of the energy storage devices 21 and the capacity difference between the reference device and each of the other energy storage devices 21 corresponding to the variation region III (S14).

Specifically, it is assumed that the actual capacity of the four energy storage devices 21 unused since manufacture is measured as follows, for example: 19.9 [Ah] for the first energy storage device A; 20.1 [Ah] for the second energy storage device B; 19.8 [Ah] for the third energy storage device C; and 20.0 [Ah] for the fourth energy storage device D. In this case, the CPU 33 calculates the actual capacity of the energy storage devices 21 and, as shown in FIG. 10, the capacity difference between the third energy storage device (19.8 [Ah]) being the reference device and each of the other energy storage devices 21 (0.1 [Ah] being a capacity difference □Cn1 for the first energy storage device, 0.3 [Ah] being a capacity difference □Cn2 for the second energy storage device, 0.2 [Ah] being a capacity difference □Cn4 for the fourth energy storage device), and stores the result in the memory 34 of the BMU 30.

Figure 9:
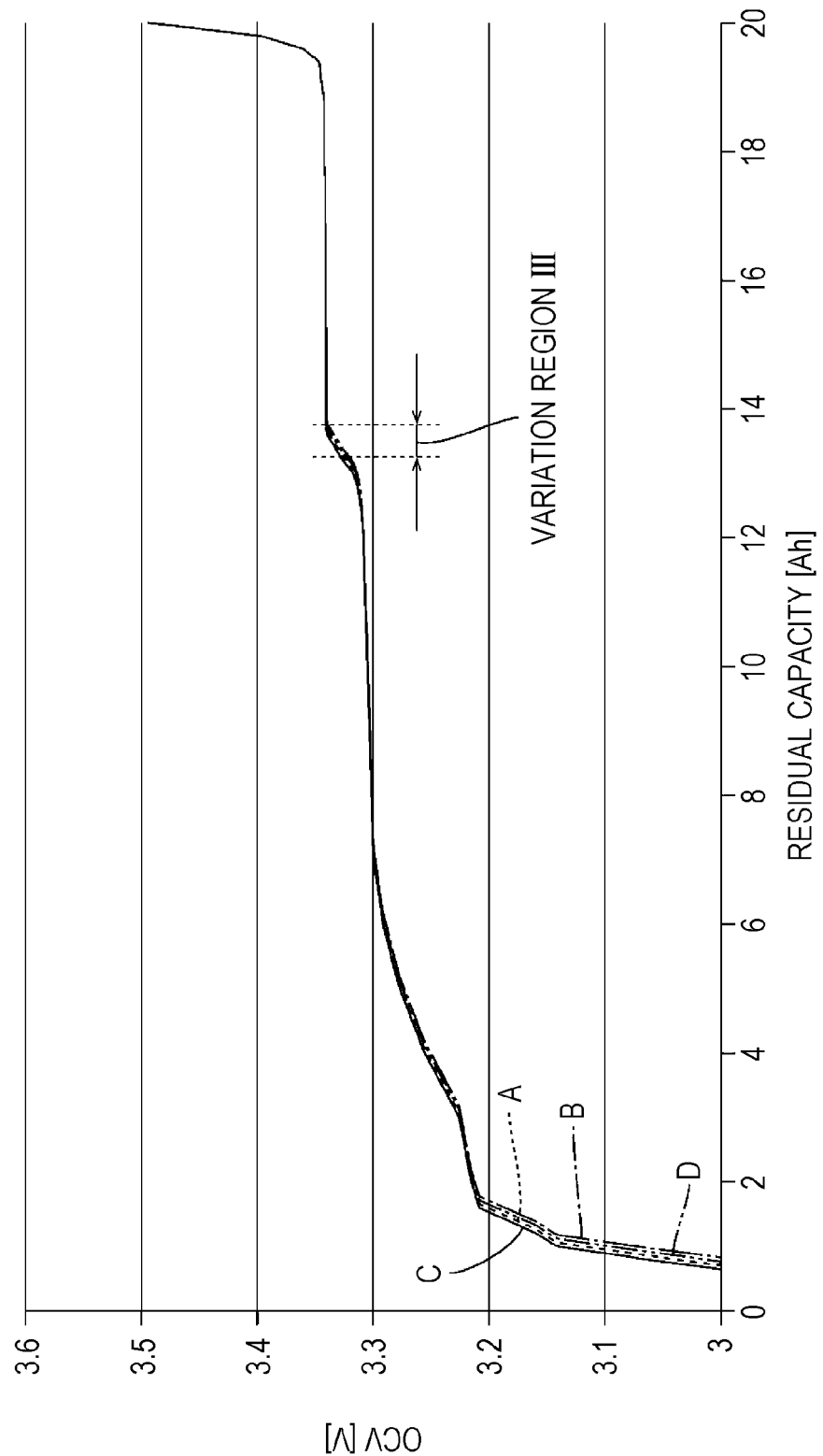
FIG. 9 is a graph showing a residual capacity-OCV correlation of the energy storage devices before use.
Figure 10:
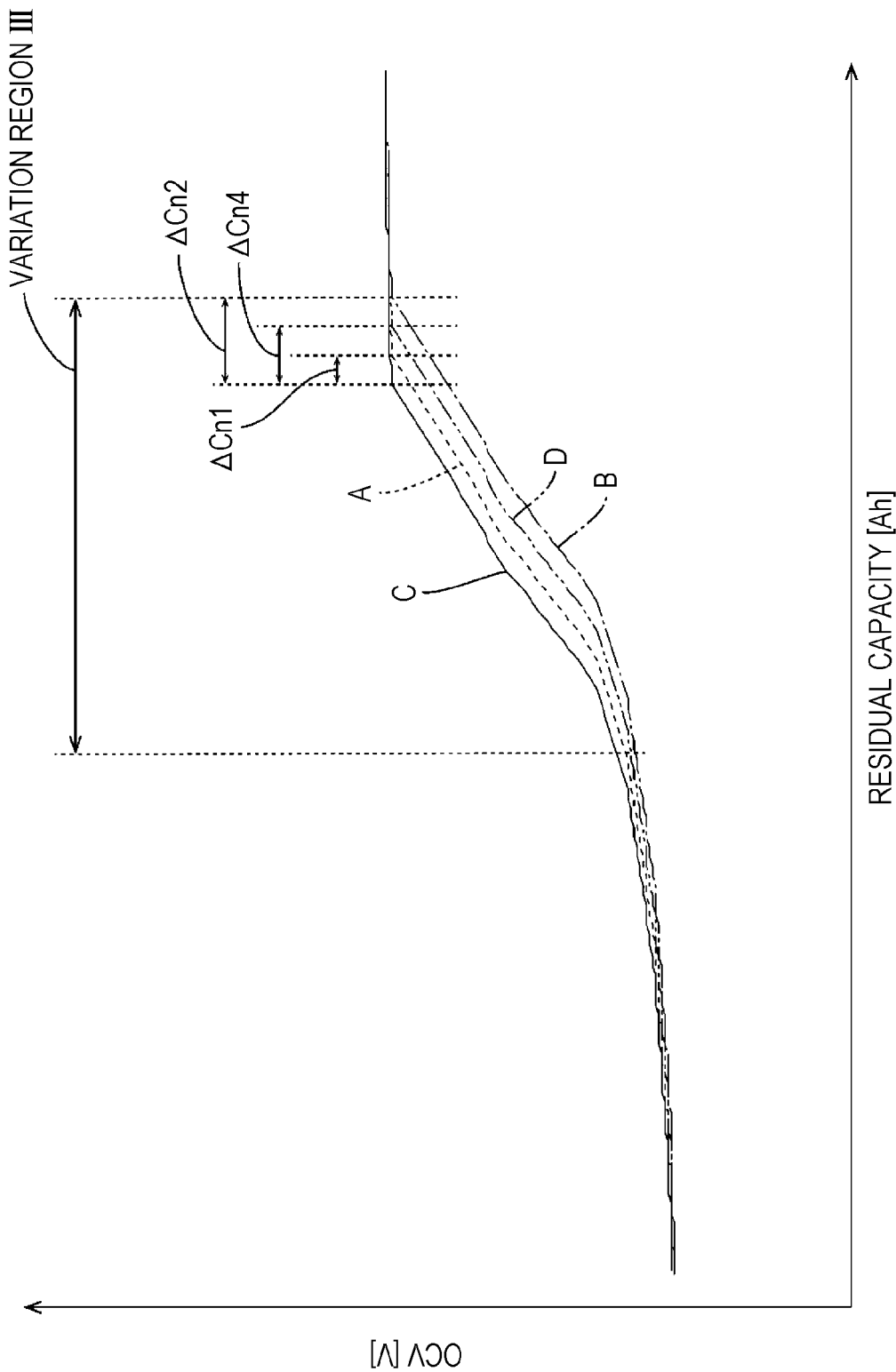
FIG. 10 is an enlarged graph of FIG. 9.

The CPU 33 stores, in the memory 34 of the BMU 30, the correspondence between the residual capacity-OCV correlation acquired from the energy storage devices 21 shown in FIGS. 9 and 10 and the capacity difference between the reference device and each of the other energy storage devices 21 (the capacity difference □Cn1 between the third energy storage device (19.8 [Ah]) being the reference device and the first energy storage device, the capacity difference □Cn2 between the third energy storage device and the second energy storage device, and the capacity difference □Cn4 between the third energy storage device and the fourth energy storage device).

On the other hand, when the energy storage devices 21 are not unused since manufacture (S11: NO), the CPU 33 employs the capacity difference at a second position, which will be described later, calculated in the previous state estimation process as the capacity difference of the first position, and executes S15 which will be described later (S12).

Next, the CPU 33 charges the energy storage devices 21 while adjusting the charging with the discharge circuits 44 so as to reduce the difference in charge amount among the energy storage devices 21, until the SOC of every energy storage device 21 attains 100[%] (the full-charge state) (S15). When the energy storage devices 21 are unused since manufacture, when the assembly of the energy storage apparatus 10 is completed, the CPU 33 charges the energy storage devices 21 while adjusting the charging with the discharge circuits 44 until the SOC of every energy storage device 21 attains 100[%] (the full-charge state).

Then, the CPU 33 discharges the energy storage devices 21 by, for example, self discharge or discharge to the vehicle load 3 after installed in the vehicle. The CPU 33 measures, with the timer 35, the time taken for the OCV of the reference device (the third energy storage device) to reach the variation region III in the residual capacity-OCV correlation, and stores the measured time in the memory 34 as the reference time (S16).

The self discharge or the discharge to the vehicle load 3 after installed in the vehicle is realized by dark current with a small current value and substantially no variations in OCV. For example, the discharge current is 1 [A] or smaller.

The CPU 33 measures, with the timer 35, the reaching time taken for every other energy storage device 21 to reach the variation region III (S17). The CPU 33 calculates, based on the relationship between the residual capacity-OCV correlation of the energy storage devices 21 stored in the memory 34 and the capacity difference between the reference device and each of the other energy storage devices 21 corresponding thereto and using the time difference between the reference time and the reaching time of each of the other energy storage devices 21, the capacity difference between the reference device (the third energy storage device) and each of the other energy storage devices 21 as the capacity difference at the second position (see FIG. 11) (S18).

The capacity difference between the reference device and each of the other energy storage devices 21 at the second position can be calculated from, for example, the reaching time taken for the energy storage devices 21 to reach the variation region III in the residual capacity-OCV correlation and the discharge current value at this time.

Next, the CPU 33 calculates, as the deterioration amount of each of the energy storage devices 21, the difference between each capacity difference at the first position stored in S12 and each capacity difference at the second position corresponding thereto calculated in S14 (S19). The CPU 33 estimates whether or not the deterioration amount of the energy storage devices 21 is smaller than an allowable deterioration value (S20). When the deterioration amount of the energy storage devices 21 is equal to or smaller than the allowable deterioration value (S20: YES), the CPU 33 estimates that the deterioration degree of the assembled battery 20 (the energy storage devices 21) is small and the assembled battery 20 is not in the abnormal state, and determines that the assembled battery 20 is continuously usable (S21).

On the other hand, when the deterioration difference is greater than the allowable deterioration value (S20: NO), the CPU 33 estimates that the deterioration degree of the assembled battery 20 (the energy storage devices 21) is great and the assembled battery 20 is in the abnormal state, and determines that the assembled battery 20 is unusable (S22).

Figure 11:
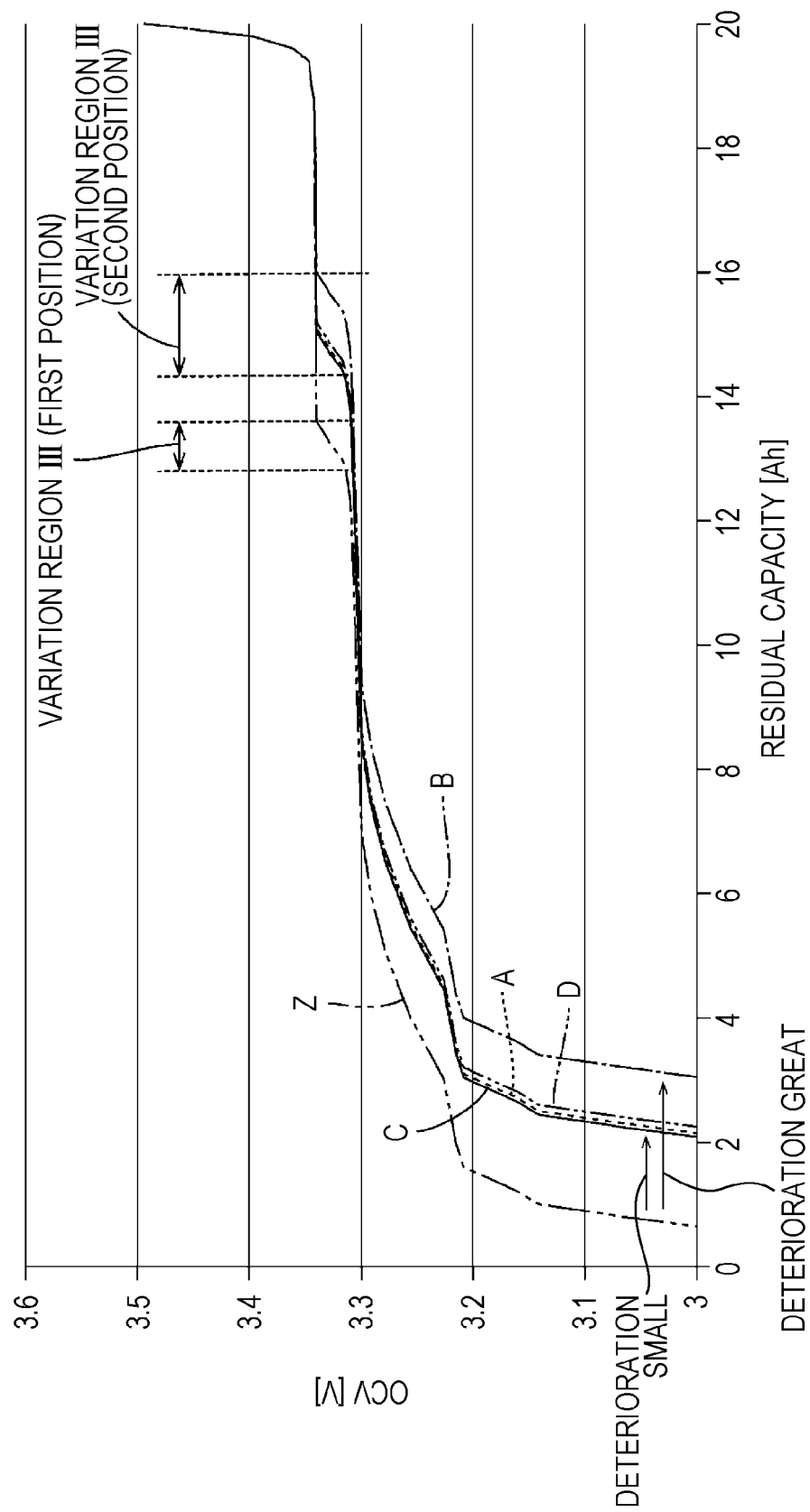
FIG. 11 is a graph showing the residual capacity-OCV correlation of energy storage devices after use.
Figure 12:
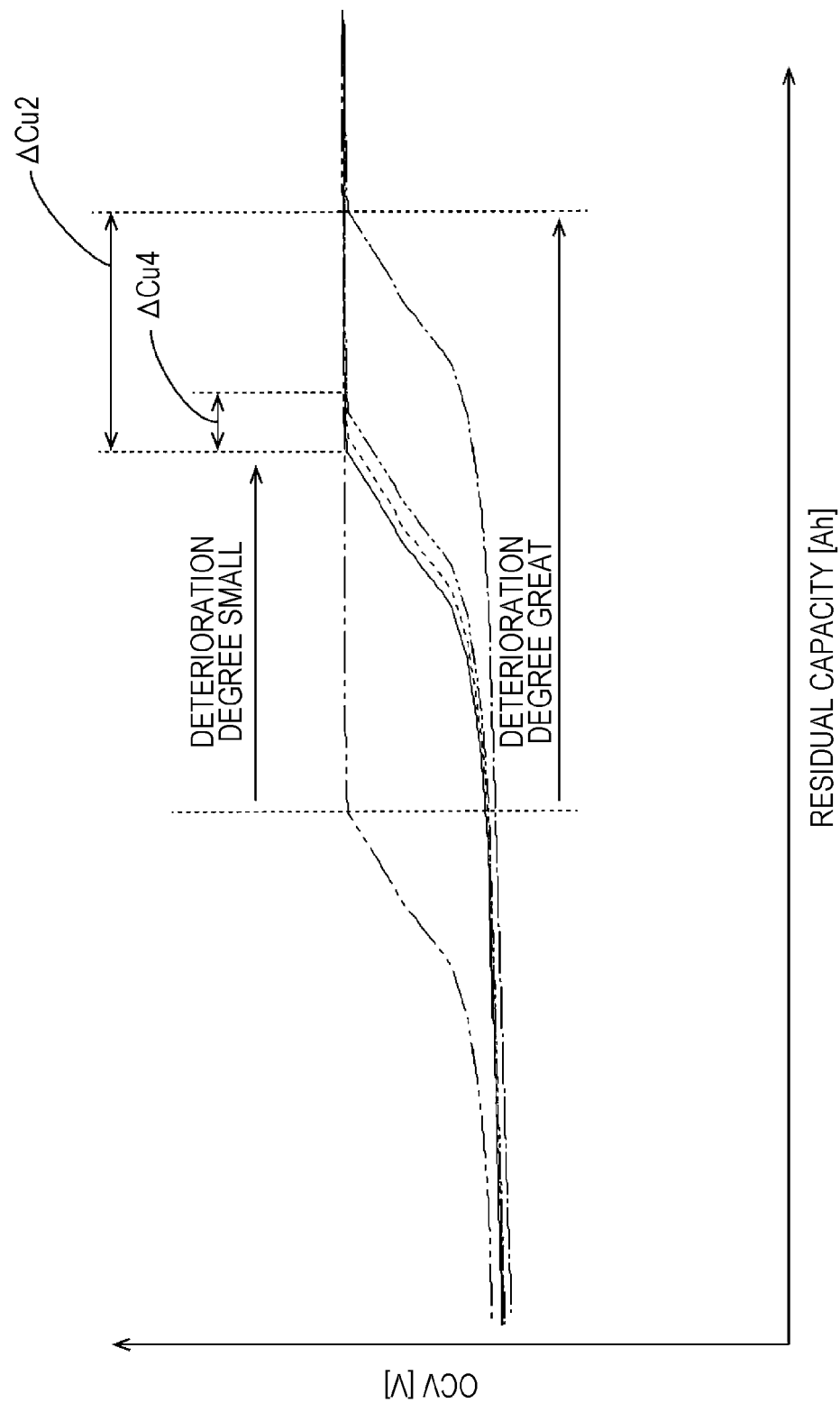
FIG. 12 is an enlarged graph of FIG. 11.

Specifically, the graphs of FIGS. 11 and 12 show the residual capacity-OCV correlation in an unused energy storage device 21 and used energy storage devices 21. The curve of a dashed-two dotted line Z represents an unused energy storage device 21, and the remaining curves represent used energy storage devices 21. The variation region III in which the residual capacity is around 13 [Ah] corresponds to the first position, and the variation region III in which the residual capacity is around from 14.5 to 16.0 [Ah] corresponds to the second position.

For example, in the case where the capacity difference □Cu4 between the reference device (the third energy storage device C) and the fourth energy storage device D both after use (at the second position) shown in FIG. 12 is 0.3 [Ah], and the capacity difference □Cn4 between the reference device and the fourth energy storage device D both being unused since manufacture (at the first position) shown in FIG. 10 is 20.0 [Ah] □ 19.8 [Ah]=0.2 [Ah], the deterioration amount of the fourth energy storage device is calculated as follows: 0.3 [Ah] □ 0.2 [Ah]=0.1 [Ah]. For example, when the allowable deterioration value is 0.2 [Ah], since the deterioration degree of the fourth energy storage device D is smaller than the allowable deterioration value and falls within the allowable range, the CPU 33 estimates that the assembled battery 20 is not in the abnormal state, and determines that the assembled battery 20 is continuously usable.

On the other hand, when the capacity difference □Cu2 between the reference device (the third energy storage device C) and the second energy storage device B both after use (at the second position) shown in FIG. 12 is 1.6 [Ah], and the capacity difference □Cn2 between the reference device and the second energy storage device B both being unused since manufacture (at the first position) shown in FIG. 10 is 20.1 [Ah] □ 19.8 [Ah]=0.3 [Ah], the deterioration amount of the second energy storage device B is calculated as follows: 1.6 [Ah] □ 0.3 [Ah]=1.3 [Ah]. Accordingly, when the allowable deterioration value is 0.2 [Ah], since the deterioration amount exceeds the allowable deterioration value, the CPU 33 estimates that the deterioration degree of the second energy storage device B is great and the assembled battery 20 is in the abnormal state.

In the above-described case, the CPU 33 determines that the assembled battery 20 is unusable based on that the second energy storage device B is estimated to be in the abnormal state while no abnormality is estimated with the third energy storage device C and the fourth energy storage device D.

For example, when the deterioration amount between the reference device (the third energy storage device C) and the second energy storage device B is 0.4 [Ah] and the deterioration amount between the third energy storage device C and the fourth energy storage device D is also 0.4 [Ah], the deterioration difference exceeds the allowable deterioration value (0.2 [Ah]) as to both the second energy storage device B and the fourth energy storage device D.

In this case, the CPU 33 estimates that the deterioration degree of the third energy storage device C is great and the third energy storage device C is in the abnormal state, and determines that the assembled battery 20 is unusable.

That is, in the state estimation process, whether or not any abnormality due to deterioration or the like is occurring with the assembled battery 20 (the energy storage devices 21). When it is estimated that some abnormality is occurring with the assembled battery 20 (the energy storage devices 21) as a result of the state estimation process, for example, an alert may be displayed on the display unit 5 (see FIG. 1) provided in the cabin of the vehicle 1 indicating that the energy storage apparatus 10 is unusable, alerting the user thereto.

As described above, the present inventors have focused on the fact that, in the relationship of residual capacity-OCV correlation (the SOC-OCV correlation), when the variation curves of the energy storage devices 21 are aligned at the position of the full-charge state as shown in FIGS. 8 and 11, deterioration of the energy storage devices 21 shortens the small-variation region IV, and shifts the varying position of the variation region III. The present inventors have found that the deterioration degree of the assembled battery 20 (the energy storage devices 21) can be estimated based on the varying position (the change in the position of the variation region III from the first position to the second position).

That is, in the state estimation process according to the present embodiment, the capacity difference between the energy storage devices of the assembled battery 20 (the energy storage devices 21) at an unused time point or before last use (the first position), and the capacity difference between the energy storage devices of the assembled battery 20 (the energy storage devices 21) after use (at the second position) are calculated. Next, by calculating the deterioration amount of the energy storage devices 21 from the capacity differences (the varying position in the residual capacity-OCV correlation), the deterioration degree of the assembled battery 20 (the energy storage devices 21) can be estimated.

From the deterioration degree, whether or not the assembled battery 20 (the energy storage devices 21) is in the abnormal state can be estimated, and whether or not the assembled battery 20 (the energy storage devices 21) is continuously usable can be determined.

As described above, though deterioration degree of the assembled battery 20 (the energy storage devices 21) can be estimated by the state estimation process, when the frequency of performing the process is small, the precision of the determination as to the usability of the assembled battery 20 (the energy storage devices 21) reduces.

However, according to the present embodiment, the high input performance and the high output performance, such as for cranking discharge required in starting the engine of the vehicle 1 or regenerative charge in decelerating the vehicle 1, are required. The deterioration degree of the assembled battery 20 (the energy storage devices 21) is estimated by performing the state estimation process based on the varying position of the variation region III where the residual capacity of the assembled battery 20 falls within a range of about from 30 to 95[%].

The frequency of performing the state estimation process can be increased as compared to the case where the state estimation process is performed in the variation region I or the variation region V of the variation regions. That is, the present embodiment improves the estimation precision in estimating whether or not the assembled battery 20 (the energy storage devices 21) is in the abnormal state.

According to the present embodiment, by calculating the deterioration degree and comparing the result against the allowable deterioration value, whether or not the assembled battery 20 (the energy storage devices 21) is usable is estimated. Thus, as compared to the case where the deterioration amounts between the energy storage devices are relatively compared against each other, the estimation precision in estimating whether or not the assembled battery 20 (the energy storage devices 21) is in the abnormal state further improves.

Second Embodiment

Next, with reference to FIGS. 13 and 14, a description will be given of a second embodiment.

The second embodiment is obtained by changing the process in S14 and the processes in S18 and the following steps in the state estimation process according to the first embodiment. Accordingly, the structure, operation, and effect identical to those of the first embodiment are not described for avoiding overlaps. Further, the structures identical to those of the first embodiment are denoted by identical reference characters.

Figure 13:
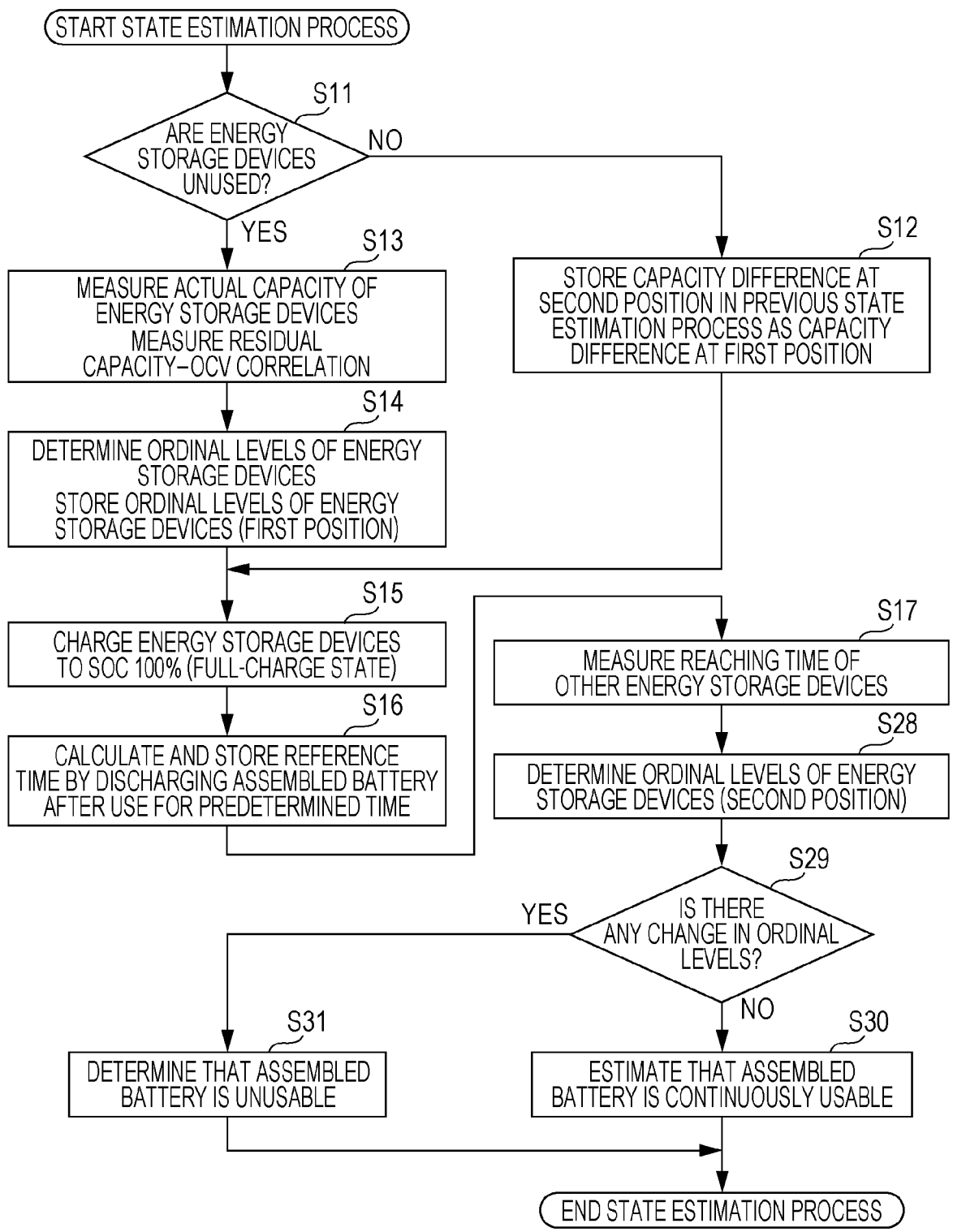
FIG. 13 is a flowchart showing a state estimation process according to a second embodiment.

As shown in FIG. 13, in the state estimation process according to the second embodiment, after measuring the actual capacity of the energy storage devices 21 in S13, the CPU 33 determines the ordinal levels of the energy storage devices 21 at an unused time point or before last use as the ordinal levels at the first position based on the actual capacity of the energy storage devices 21, and stores the ordinal levels in the memory 34 of the BMU 30 (SD).

After measuring the reaching time in S17, the CPU 33 determines the ordinal levels based on the actual capacity of the assembled battery 20 (the energy storage devices 21) after use from the reference time and the reaching time measured in S16 and S17 as the ordinal levels at the second position (SD).

The CPU 33 determines whether or not the ordinal levels at the first position of the energy storage devices 21 stored in SD and the ordinal levels at the second position of the energy storage devices 21 determined in SD have changed (SD). When the ordinal levels have not been changed (SD: YES), the CPU 33 estimates that the assembled battery 20 is not in the abnormal state based on that there exist no significantly deteriorated energy storage devices 21 and the deterioration degree of the assembled battery 20 is small, and the CPU 33 determines that the assembled battery 20 is continuously usable (Se).

On the other hand, when the ordinal levels have changed (SD: NO), the CPU 33 estimates that the assembled battery 20 is in the abnormal state based on that there exist significantly deteriorated energy storage devices 21 and the deterioration degree of the assembled battery 20 is great, and the CPU 33 determines that the assembled battery 20 is unusable (Se).

Specifically, in the residual capacity-OCV correlation of the energy storage device 21, as shown in FIG. 10, when the ordinal levels of the reaching time for the energy storage devices 21 before use of the assembled battery to reach the variation region III are in order of the third energy storage device C, the first energy storage device A, the fourth energy storage device D, and the second energy storage device B, the ordinal levels in ascending order of the actual capacity of the energy storage devices 21 are determined as in order of the third energy storage device C, the first energy storage device A, the fourth energy storage device D, and the second energy storage device B.

Figure 14:
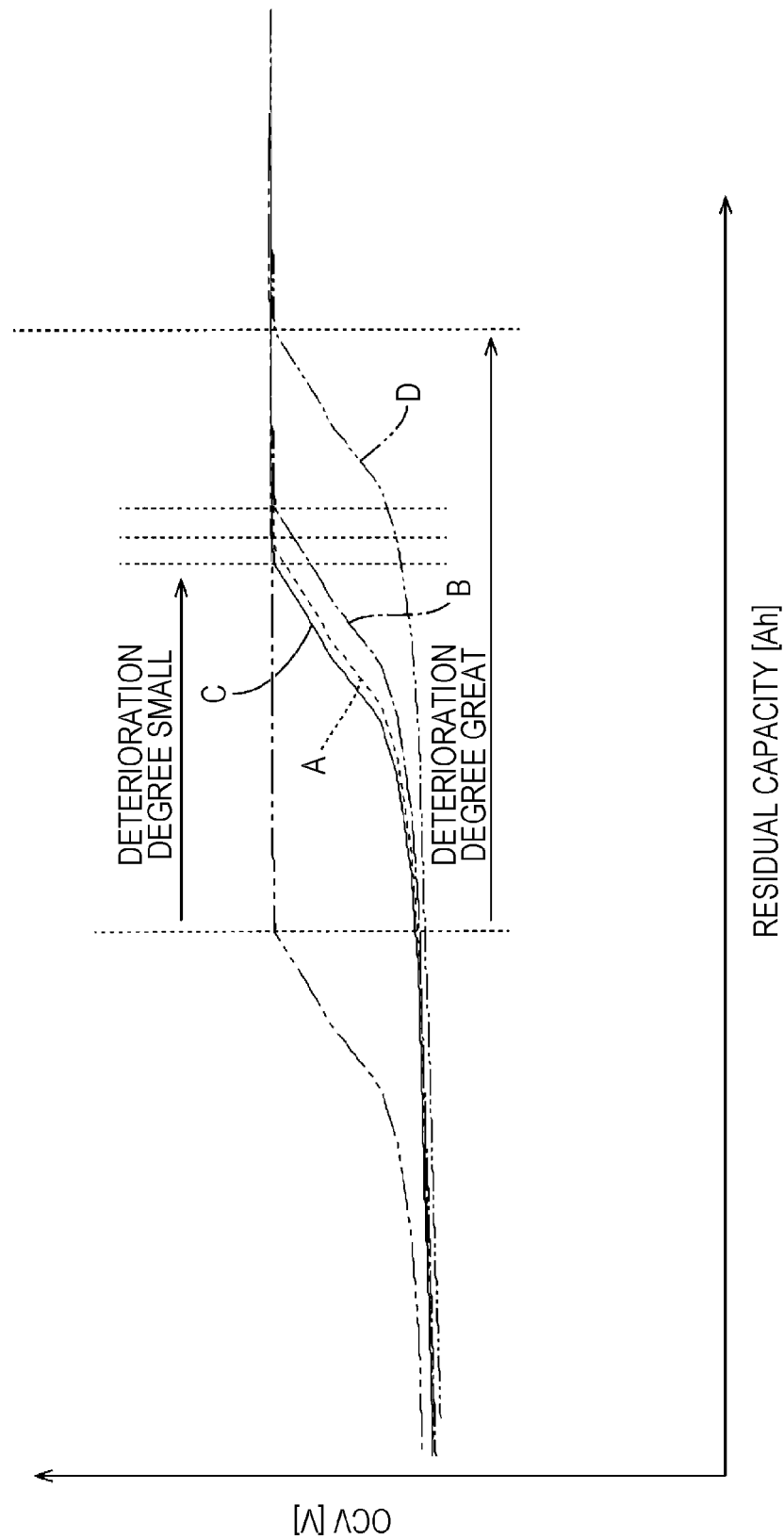
FIG. 14 is an enlarged graph according to the second embodiment corresponding to FIG. 12.

As shown in FIG. 14, when the ordinal levels of the reaching time for the deteriorated energy storage devices 21 due to use of the assembled battery 20 to reach the variation region III of are in order of the third energy storage device C, the first energy storage device A, the second energy storage device B, and the fourth energy storage device D, the ordinal levels in ascending order of the actual capacity of the energy storage devices 21 are determined as in order of the third energy storage device C, the first energy storage device A, the second energy storage device B, and the fourth energy storage device D.

Next, whether or not the ordinal levels have changed before and after use of the assembled battery 20 is determined.

The ordinal level of the second energy storage device B and that of the fourth energy storage device D are reversed before use (see FIG. 10) and after use (see FIG. 14). That is, the CPU 33 estimates that the deterioration degree of one of the energy storage devices 21, i.e., the second energy storage device B or the fourth energy storage device D, is great and the assembled battery 20 is in the abnormal state, and the CPU 33 determines that the assembled battery 20 is unusable.

Without the necessity of performing complicated processes, such as calculating the capacity difference between the energy storage devices 21 and calculating the deterioration amount of the energy storage devices 21, by comparing the ordinal levels of the energy storage devices 21 at an unused time point or before last use and the ordinal levels of the energy storage devices 21 after use against each other, whether or not the assembled battery 20 is in the abnormal state can be estimated. Thus, whether or not the assembled battery 20 (the energy storage devices 21) is usable can be determined.

As has been described above, in the present embodiment, just the comparison between the ordinal levels of the energy storage devices 21 at an unused time point or before last use and the ordinal levels of the energy storage devices 21 after use is performed. The present disclosure is not limited thereto, and just when the ordinal levels have been changed, the capacity difference of the energy storage devices 21 may be calculated and the deterioration amount may be estimated. Alternatively, the deterioration amount may be estimated just for the energy storage devices 21 whose ordinal levels have been changed.

Other Embodiments

The technique disclosed in the present specification is not limited to the embodiments described above and the drawings referred to, and includes the following various modes, for example. In the above-described embodiments, a lithium ion battery using a positive active material of iron phosphate is employed as an exemplary electrochemical device. The present disclosure is not limited thereto.

The electrochemical device may be a secondary battery other than a lithium ion secondary battery, a lithium ion primary battery, a primary battery other than a lithium ion primary battery, or a capacitor such as an electric double-layer capacitor associated with an electrochemical phenomenon.

Figure 15:
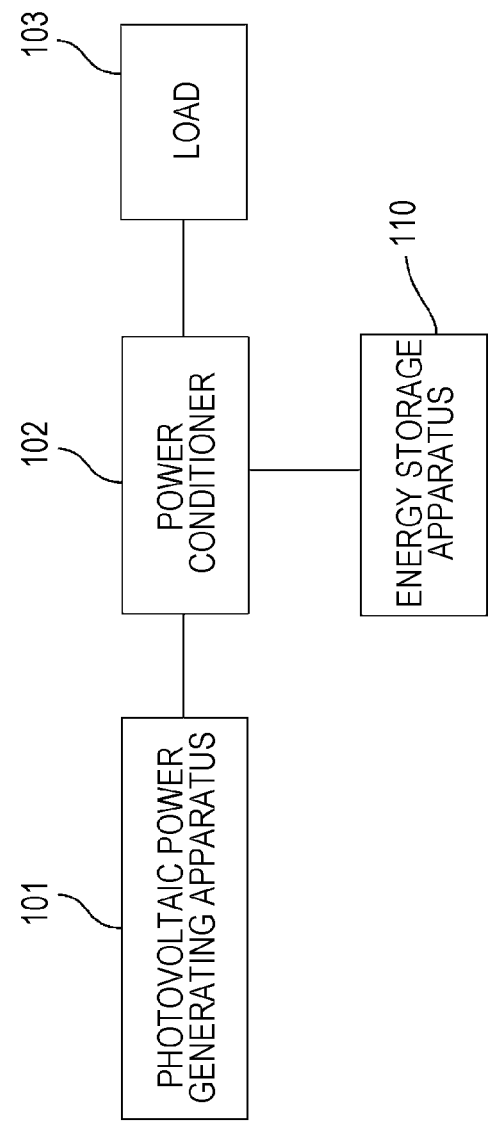
FIG. 15 illustrates a solar power generating system according to another embodiment.

(1) In the above-described embodiments, the energy storage apparatus 10 is installed in the vehicle 1. The present disclosure is not limited thereto. As shown in FIG. 15, the present disclosure is applicable to an energy storage apparatus 110 of a household solar power generating system connected to a photo voltaic power generating apparatus 101 whose electromotive force is sunlight and a load 103 via a power conditioner 102. Alternatively, the present disclosure is applicable to an energy storage apparatus of a large-capacity power generating system.

With the large-capacity power generating system, the state estimation process may be executed via a server or the like by a remote operation or the like from a remote location.

(2) In the first embodiment, the residual capacity-OCV correlation (the SOC-OCV correlation) of the energy storage devices 21 is divided into five regions, and based on the varying position (the variation from the first position to the second position) of the variation region III of the resultant five regions, the deterioration amount of the energy storage devices 21 is calculated. The present disclosure is not limited thereto. In the case where use frequency in the variation region I or the variation region V of the resultant regions is great, the deterioration amount of the energy storage devices 21 may be calculated based on the varying position of the variation region I or the variation region V.

(3) In the above-described embodiments, in the state estimation process, the deterioration amount of the energy storage devices 21 is calculated and compared against the allowable deterioration value. When the deterioration amount exceeds the allowable deterioration value, it is estimated that the assembled battery 20 is in the abnormal state. The present disclosure is not limited thereto. The deterioration amounts of respective energy storage devices may be compared against each other, and when the difference in deterioration amount of the energy storage devices exceeds a predetermined value, it may be estimated that the assembled battery is in the abnormal state.

(4) In the above-described embodiments, the discharging in S16 of the state estimation process is realized by dark current with a small current value and substantially no variations in OCV. The present disclosure is not limited thereto. As long as the capacity difference (the capacity variations) is detectable by constant current discharge that continues for a predetermined time, it may be, for example, a constant current discharge of 20A continuing for about 10 seconds.

(5) In the above-described embodiments, in the state estimation process, the capacity difference (the capacity variations) between the energy storage devices 21 is detected by causing the energy storage devices 21 to attain the full-charge state and discharging the energy storage devices 21. The present disclosure is not limited thereto. The capacity difference (capacity variations) between the energy storage devices 21 may be detected by, after discharging the energy storage devices 21 to the end-of-discharge voltage, subjecting the energy storage devices 21 to constant current charge.

(6) In the above-described embodiments, by performing the state estimation process in the battery management unit 30 of the energy storage apparatus 10 installed in the vehicle 1, whether or not the energy storage device 21 is in the abnormal state is estimated. The present disclosure is not limited thereto. A state estimation method for estimating the state of an assembled battery including a plurality of energy storage devices for any of various energy storage apparatuses is applicable. In the method, the energy storage devices each have a small-variation region where an OCV variation amount relative to an actual capacity is smaller and a variation region where the OCV variation amount relative to the actual capacity is greater than in the small-variation region. Based on the varying position of the variation region relative to the actual capacity of the plurality of energy storage devices, the state of the assembled battery is estimated.

(7) In the above-described embodiments, the deterioration degree of the assembled battery 20 (the energy storage devices 21) is estimated based on the varying position of the variation region III (the change in the position of the variation region III from the first position to the second position) in the correlation between a residual capacity and an OCV in which the X-axis indicates the residual capacity [Ah] of the energy storage devices 21 and the Y-axis indicates an OCV [V]. The present disclosure is not limited thereto. The deterioration degree of the assembled battery may be estimated based on the varying position of the variation region III in the correlation between a residual capacity and an OCV in which the X-axis indicates the SOC of the energy storage devices [%] and the Y-axis indicates the OCV [V].

The invention claimed is:

1. A state estimation apparatus configured to estimate a state of an assembled battery including a plurality of energy storage devices, the state estimation apparatus comprising: a voltage detecting circuit; and
a central processing unit,
wherein:
the energy storage devices each have a small-variation region where an open circuit voltage (OCV) variation amount relative to a residual capacity is smaller,
a variation region where the OCV variation amount relative to the residual capacity is greater than the OCV variation amount relative to the residual capacity in the small-variation region,
the state of the assembled battery is estimated, via the central processing unit and the voltage detecting circuit, based on a comparison of a change in a position of the variation region with an actual capacity of the plurality of energy storage devices,
the energy storage devices each have an intermediate region being the variation region between the small-variation region, and
the state of the assembled battery is further estimated, via the central processing unit and the voltage detecting circuit, based on a comparison of a change in a position of the intermediate region with the actual capacity.

2. The state estimation apparatus according to claim 1, wherein the state of the assembled battery is estimated based on a comparison as to the varying position of the intermediate region in each of the energy storage devices.

3. The state estimation apparatus according to claim 1, wherein the state of the assembled battery is estimated by calculating a variation amount of the actual capacity in each of the energy storage devices based on a first position that is a position of the intermediate region of the plurality of energy storage devices at an unused time point or before last use and a second position that is a position of the intermediate region of the plurality of energy storage devices after use.

4. The state estimation apparatus according to claim 3, wherein, when the variation amount of the actual capacity in each of the energy storage devices becomes outside an allowable range within a predetermined time, an occurrence of an abnormality with the assembled battery is estimated.

5. The state estimation apparatus according to claim 1, wherein the energy storage devices are each a lithium ion battery using a positive active material including lithium iron phosphate.

6. The state estimation apparatus according to claim 1, wherein the small-variation region is a region where variations in the OCV are from 2 to less than 6 [mV] relative to a variation of 1 [%] in a state of charge (SOC).

7. The state estimation apparatus according to claim 1, wherein a comparison between ordinal levels of the energy storage devices at an unused time point or before last use and ordinal levels of the energy storage devices after use is performed.

8. The state estimation apparatus according to claim 7, wherein, when at least one of: the ordinal levels of the energy storage devices at the unused time point or before the last use, or the ordinal levels of the energy storage devices after the use have been changed, a capacity difference of the energy storage devices is calculated, and a deterioration amount is estimated.

9. The state estimation apparatus according to claim 7, wherein, when at least one of: the ordinal levels of the energy storage devices at the unused time point or before the last use, or the ordinal levels of the energy storage devices after the use have been changed, the deterioration amount is estimated just for the energy storage devices of which the ordinal levels have been changed.

10. An assembled battery comprising:
a plurality of energy storage devices; and
the state estimation apparatus according to claim 1.

11. The assembled battery according to claim 10, wherein the plurality of energy storage devices vary in actual capacity.

12. The assembled battery according to claim 10, wherein a comparison of a deterioration amount of the plurality of energy storage devices is performed.

13. The assembled battery according to claim 12, wherein, when the deterioration amount of the plurality of energy storage devices exceeds a predetermined value, the assembled battery is estimated to be in an abnormal state.

14. The assembled battery according to claim 10, wherein the capacity difference between the plurality of energy storage devices is detected at a time point when the plurality of energy storage devices have been subjected to a constant current charge after the plurality of energy storage devices are discharged to an end-of-discharge voltage.

15. A vehicle comprising the assembled battery according to claim 10.

16. The vehicle according to claim 15, wherein the vehicle further comprises a starting motor configured to start an engine, and the assembled battery is connected to the starting motor.

17. The vehicle according to claim 15, wherein an alert is displayed in case of the abnormal state.

18. An energy storage system comprising:
the state estimation apparatus according to claim 1;
a photovoltaic power generating apparatus; and
a power conditioner.

19. The energy storage system according to claim 18, wherein the energy storage system is operable from a remote location via a server.

20. A state estimation method of estimating, via a state estimation apparatus, a state of an assembled battery including a plurality of energy storage devices,
wherein:
the energy storage devices each have a small-variation region where an open circuit voltage (OCV) variation amount relative to a residual capacity is smaller, and a variation region where the OCV variation amount relative to the residual capacity is greater than the OCV variation amount relative to the residual capacity in the small-variation region, and
the energy storage devices each have an intermediate region being the variation region between the small-variation region, and
the method comprises:
estimating, via a voltage detecting circuit and a central processing unit of the state estimation apparatus, the state of the assembled battery based on a comparison of a change in a position of the variation region relative to an actual capacity of the plurality of energy storage devices, and
estimating, via the voltage detecting circuit and the central processing unit, the state of the assembled battery further based on a varying position of the intermediate region relative to the actual capacity of the plurality of energy storage devices.

21. An energy storage system comprising:
a state estimation apparatus;
a photovoltaic power generating apparatus; and
a power conditioner,
wherein:
the state estimation apparatus is configured to estimate a state of an assembled battery including a plurality of energy storage devices,
the energy storage devices each have a small-variation region where an open circuit voltage (OCV) variation amount relative to a residual capacity is smaller,
a variation region where the OCV variation amount relative to the residual capacity is greater than the OCV variation amount relative to the residual capacity in the small-variation region, and
the state of the assembled battery is estimated based on a comparison of a change in a position of the variation region with an actual capacity of the plurality of energy storage devices.

\* \* \* \* \*